(12) United States Patent
Ivanov et al.

(10) Patent No.: US 11,062,889 B2
(45) Date of Patent: Jul. 13, 2021

(54) METHOD OF PRODUCTION OF UNIFORM METAL PLATES AND SPUTTERING TARGETS MADE THEREBY

(71) Applicant: Tosoh SMD, Inc., Grove City, OH (US)

(72) Inventors: Eugene Y. Ivanov, Grove City, OH (US); Eduardo del Rio, Dublin, OH (US)

(73) Assignee: TOSOH SMD, INC., Grove City, OH (US)

( * ) Notice: Subject to any disclaimer, the term of this patent is extended or adjusted under 35 U.S.C. 154(b) by 537 days.

(21) Appl. No.: 15/993,075

(22) Filed: May 30, 2018

(65) Prior Publication Data

US 2018/0374690 A1 Dec. 27, 2018

Related U.S. Application Data

(60) Provisional application No. 62/524,837, filed on Jun. 26, 2017.

(51) Int. Cl.
| | | |
|---|---|---|
| *H01J 37/34* | (2006.01) |
| *C23C 14/34* | (2006.01) |
| *B22F 5/00* | (2006.01) |
| *B22F 3/18* | (2006.01) |
| *B22F 3/16* | (2006.01) |

(52) U.S. Cl.
CPC .......... *H01J 37/3417* (2013.01); *B22F 3/162* (2013.01); *B22F 3/18* (2013.01); *B22F 5/006* (2013.01); *C23C 14/3414* (2013.01); *H01J 37/3423* (2013.01); *B22F 2998/10* (2013.01)

(58) Field of Classification Search
CPC .. C23C 14/3414; H01J 37/3417; B22F 3/162; B22F 3/18
See application file for complete search history.

(56) References Cited

U.S. PATENT DOCUMENTS

| | | |
|---|---|---|
| 5,590,389 A | 12/1996 | Dunlop et al. |
| 6,193,821 B1 | 2/2001 | Zhang |
| 6,238,494 B1 | 5/2001 | Segal |
| 6,302,977 B1 | 10/2001 | Liu |
| 6,770,154 B2 | 8/2004 | Koenigsmann et al. |
| 6,896,748 B2 | 5/2005 | Perry et al. |
| 7,101,447 B2 | 9/2006 | Turner |
| 7,776,166 B2 | 8/2010 | Pigur et al. |

(Continued)

FOREIGN PATENT DOCUMENTS

| | | |
|---|---|---|
| EP | 1 366 203 B1 | 9/2006 |
| JP | 5 069 201 B2 | 11/2012 |
| WO | WO 2016/164269 A1 | 10/2016 |

OTHER PUBLICATIONS

Michaluk, C.A., "Correlating Discrete Orientation and Grain Size to the Sputter Deposition Properties of Tantalum", Journal of Electronic Materials, vol. 31, Issue 1, pp. 2-9, Jan. 2002, Abstract.

(Continued)

*Primary Examiner* — John J Brayton
(74) *Attorney, Agent, or Firm* — Wegman Hessler

(57) ABSTRACT

A method of making a metal or metal alloy target having the steps of providing a billet, the billet having a generally cylindrical configuration and having a central axis, cutting the billet in half parallel to the central axis to form at least a half cylindrical blank, and cross rolling the half cylindrical blank to form a target.

11 Claims, 4 Drawing Sheets

(56) References Cited

U.S. PATENT DOCUMENTS

| | | |
|---|---|---|
| 7,998,287 B2 | 8/2011 | Wickersham, Jr. et al. |
| 8,382,920 B2 | 2/2013 | Carpenter et al. |
| 8,580,053 B2 | 11/2013 | Sato et al. |
| 9,017,493 B2 | 4/2015 | Hagihara et al. |
| 9,095,885 B2 | 8/2015 | Jepson et al. |
| 9,150,956 B2 | 10/2015 | Miao et al. |
| 9,150,957 B2 | 10/2015 | Holcomb et al. |
| 9,579,723 B2 | 2/2017 | Chen |
| 9,767,999 B2 | 9/2017 | Jepson et al. |
| 9,773,651 B2 | 9/2017 | Okabe et al. |
| 9,783,882 B2 | 10/2017 | Miller et al. |
| 2002/0112789 A1 | 8/2002 | Jepson et al. |
| 2005/0236076 A1 | 10/2005 | Michaluk et al. |

OTHER PUBLICATIONS

Li, X.R. et al., "Effects of Thermomechanical Processing on the Recrystallization Texture and Grain Size of Al-1%Si Sputtering Target Material", 17th International Conference on Textures of Materials, IOP Conference Series: Materials Science and Engineering, vol. 82, 6 pages, 2015.

METHOD OF PRODUCTION OF UNIFORM METAL PLATES AND SPUTTERING TARGETS MADE THEREBY

CROSS REFERENCE TO RELATED APPLICATION

This application claims the priority benefit of U.S. Provisional Patent Application Ser. No. 62/524,837 filed Jun. 26, 2017 and is incorporated herein by reference.

FIELD OF INVENTION

The present invention relates to metal and metal alloy target plates usable as sputtering targets and to methods of making same, wherein the plates produced exhibit uniform texture structure through thickness. This invention yields a Ta sputtering target that yields improved film uniformity of grain size and texture throughout thickness.

BACKGROUND

The crystallographic texture of a plate used as a sputtering target is of great importance to the sputtering performance, particularly to the uniformity of thickness of the thin films deposited on substrates. Only a plate with uniform texture throughout its volume will give optimum performance, and users rely on a steady supply of plates with similar texture. However, the manufacture of plates by existing, state-of-the-art methods do not produce uniform texture.

The heterogeneity of texture found in the sputtering target plate manufactured with known processes cause unpredictability in the sputtering rate (defined as the number of metal atoms sputtered onto the substrate per impinging sputter gas, such as argon ion). Also, heterogeneity of texture causes heterogeneity of the direction in which sputtered atoms leave the target. Unpredictability of sputtering rate and sputtering direction causes variation of the thickness of the film produced from point to point on the substrate, and also causes variation of average thickness of the film produced on the substrate from substrate to substrate, and from target to target.

Currently, the production of plates where texture is substantially uniform throughout the volume of the plate includes multiple cycles of forging techniques, rolling, and heat-treatment to produce a final microstructure with a uniformity of texture. However, use of such forging techniques, such as upset-and-forge-back, are susceptible to cause various types of defects in the worked metal, for example cracks, folds and misshapes, any of which will reduce the proportion of the worked metal which can be used as targets (i.e. reduce the yield), and are usually performed at a higher cost.

Therefore, what is needed is a simplified method of producing uniform texture metal and metal alloy target plates usable as sputtering targets, wherein the plates produced exhibit uniform texture structure through thickness.

SUMMARY OF INVENTION

In one exemplary embodiment, a method of making a metal or metal alloy target is disclosed. The method comprises the steps of: a) providing a billet, the billet having a generally cylindrical configuration and having an x, y and z dimensional direction, wherein the x direction is the central axis, b) sectioning the billet by cutting the billet parallel to a first dimensional direction to form at least a pair of target blanks, c) cutting the pair of target blanks in half parallel to the central axis to form at least a pair of half cylindrical blanks, and d) cross rolling each of the half cylindrical blanks to form a target.

In some embodiments, the first dimensional direction is the y direction. In some embodiments, the billet is Ta or Ta alloy. In other embodiments, the billet is Nb, Fe, Co, Al, Cu, or Ti. In other embodiments, the billet is formed by compacting a metal powder, wherein the metal power is a metal or metal alloy power and is selected from the group consisting of Nb, Fe, Co, Al, Cu, Ti or Ta.

In some embodiments, the step of cutting the target blank in half forms at least a pair of half cylindrical blanks. In some embodiments, the step of cross rolling includes the step of feeding a half cylindrical blank through a rolling mill.

In some embodiments, the target has a predominate mix of {100} and {111} textures and has reduced {100} and {111} banding factors wherein each of the B {100} and B {111} banding factors is less than 7%, and wherein B {100} and B {111} are each less than 7%. In some embodiments, the Ta has a purity of 99.95% and greater, and a uniform grain size of about 100 microns or less.

In yet another exemplary embodiment, a thin film for semiconductor applications is provided. The thin film for semiconductor application is created by using the method according to the previous embodiments, where variation in film thickness uniformity (percent non-uniformity) is 3% or less, and variation in sheet resistance, within wafers, and between wafers is 3% or less.

DESCRIPTION OF THE INVENTION

The present invention generally describes a method of producing metal or metal alloy target plates usable as sputtering targets, wherein the plates produced exhibit uniform texture structure through thickness. This invention yields a sputtering target that yields improved film uniformity of grain size and texture throughout thickness.

In one embodiment, a method of making a metal or metal alloy target is described. A billet is first provided, wherein the billet selected includes a generally cylindrical configuration and a central axis.

Figure 1:
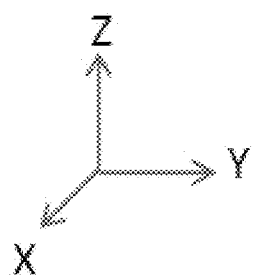
FIG. 1 is a depiction of the x, y, and axis of the billet provided in accordance with the present invention.

It will be apparent to one of ordinary skill in the art that the metal or metal alloy target is prepared by providing a generally cylindrical billet having an x direction, a y direction perpendicular to the x direction, and a z direction perpendicular to the plane defined by vectors extending in the x and y direction, as shown in FIG. 1. The centerline of the billet is defined as the central axis or x axis of the original billet.

In some embodiments, the billet comprises a metal or metal alloy selected from the group consisting of Nb, Fe, Co, Al, Cu, or Ti. In other embodiments, the metal or metal alloy is Ta. In some embodiments, the metal alloy is a Ta/Nb alloy.

In some embodiments, the method of the present invention may start, alternatively, with a metal powder, and using conventional methods of consolidating or compacting the powder to form the billet, wherein the method described herein uses the same improved rolling techniques to produce a plate with improved uniformity of texture. In such embodiments, the metal powder is a metal or metal alloy power and is selected from the group consisting of Nb, Fe, Co, Al, Cu, Ti or Ta.

After the billet has been provided, a target blank is first sectioned from the billet. The billet is cut parallel to a first dimensional direction to form at least a pair of target blanks. In some embodiments, the first dimensional direction is y axis or y direction. In some embodiments, the pair of target blanks are 18" in diameter by 0.7" in height. In other embodiments, the pair of target blanks are 5" in diameter by 10" in height. In some embodiments, the sectioning step of the present method may be repeated to obtain target blanks of a certain desired dimension.

Subsequent to the sectioning step, the billet is subjected to a cutting step, wherein the target blanks are subsequently cut in half, parallel to the central axis to produce at least a pair of half cylindrical blanks. In some embodiments, a single half cylindrical blank has a weight of approximately 1.75 times the final target weight (i.e., the half cylindrical blank itself weighs about 1.75 times a final target weight). In other embodiments, the half cylindrical blank has a weight of approximately 1.75 times the final target weight.

After the cutting step, the half cylindrical blanks are cross rolled or clock rolled to form a target. One skilled in the art would understand that cross rolling and clock rolling are terms of art and are used interchangeably. During cross rolling, the centerline of the billet is maintained in the center of the billet and parallel to the compressive forces used during fabrication.

Figures 4A, 4B:
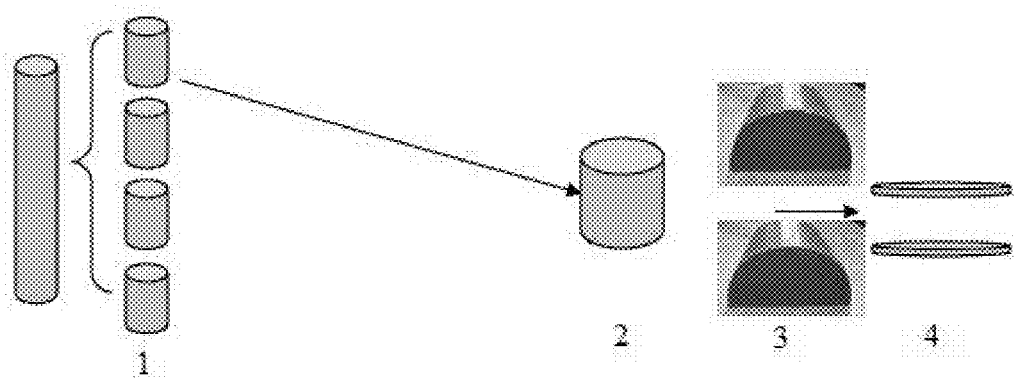
FIGS. 4A and 4B provide a general schematic of the method in accordance with an embodiment of the present invention.

As shown in FIGS. 4A-4B, a general schematic is shown which illustrates the method in accordance with the present invention. As shown by (1)-(2) in FIGS. 4A-4B, the billet (#1 in FIG. 4A) provided is first sectioned to form a target blank (#2 in FIG. 4B). One skilled in the art would understand that the billet may sectioned to form as many target blanks as needed. As shown by (3), the target blank is cut in half parallel to the central axis to form a half cylindrical blank. In some embodiments, each target blank is cut in half parallel to the central axis to form at least a pair of half cylindrical blanks. Finally, as shown by (4), the half cylindrical blank is cross rolled in at least one of the dimensional directions to form a target. In some embodiments, the pair of cylindrical blanks are each cross rolled to form a pair of targets. Cross rolling creates a plate with close to 1:1 aspect ratio, a more uniform target texture and avoids elongated grains in one direction.

In some embodiments, the step of cross rolling includes the step of feeding a half cylindrical blank through a rolling mill. One advantage that should be recognized is that by utilizing a rolling mill, there is no need to use alternative methods, such as asymmetric rolling where different rolling rates or different roll diameters are used in the process.

After the half cylindrical blanks are subjected to the cross rolling step, the half cylindrical blanks are followed by a vacuum anneal. Recrystallization annealing may be performed after the cross or clock rolling steps. This processing results in near net shape blanks for usage as a sputter targets.

"Recrystallization", as used herein, is a term of art, known to those skilled in the art of metallurgy, and refers to a plate having at least 85%, 90%, 95%, 96%, 97%, 98%, 99%, 99.5%, or higher recrystallization. Typically, the amount of recrystallization is determined after the final annealing step, when a sample is taken from the edge of the plate and examined microscopically.

In some embodiments, the recrystallization annealing steps are performed at about 900-1200° C., and, for example, may be performed under vacuum conditions after the cross rolling or clock rolling steps. The various cross roll or clock rolling steps may, in some embodiments, result in about 60% area reduction.

The present method results in at least a pair of near net target shape blanks that may be used as suitable sputter targets after appropriate final machining and/or polishing steps. In some embodiments, the present method is suitable for TEL style or other rectangular target production.

In some embodiments, the targets produced by the above methods will have an average through-thickness gradient of less than or equal to 2% per mm, more preferably less than 1.25%, most preferably less than 1%.

In some embodiments, the Ta and Ta alloy targets are provided wherein the Ta is at least 99.95% pure and has an interstitial content (C, O, N, H) of less than about X ppm. The Ta targets in accordance with the invention have a uniform grain size of about 75-150 microns and a mixed homogenous $\{100\}/\{110\}/\{111\}$ texture throughout the thickness of the blank.

Figure 2A:
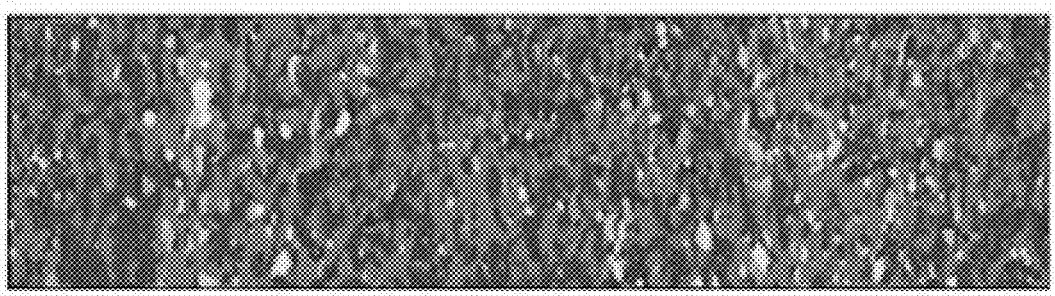
FIGS. 2A, 2B and 2C are grain maps of the center, middle and edge, respectively, of the Ta plate in accordance with one embodiment of the present invention.
Figure 2B:
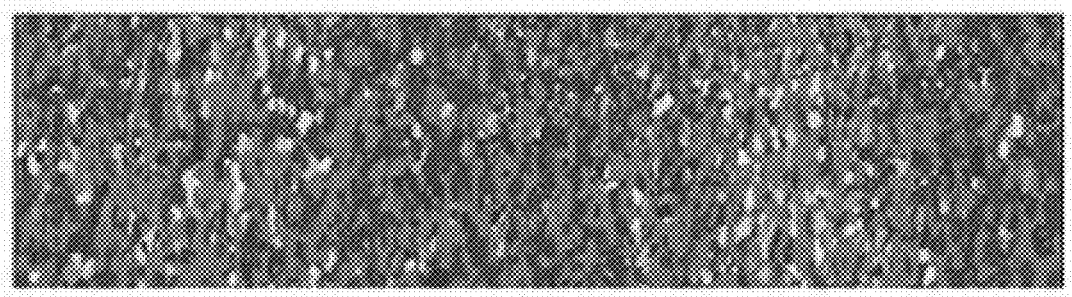
Figure 2C:
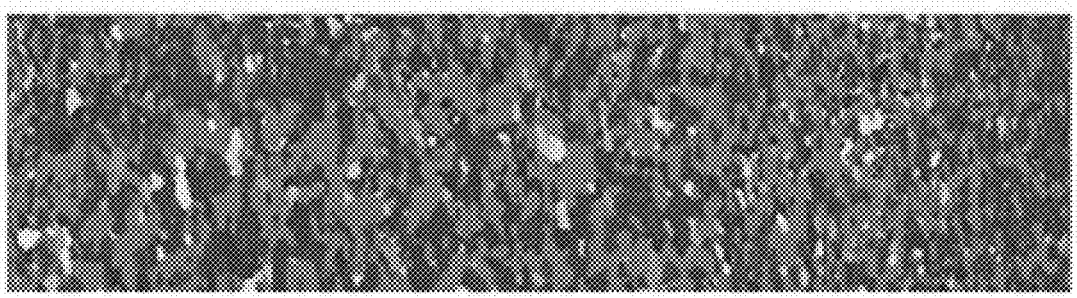
Figure 3A:
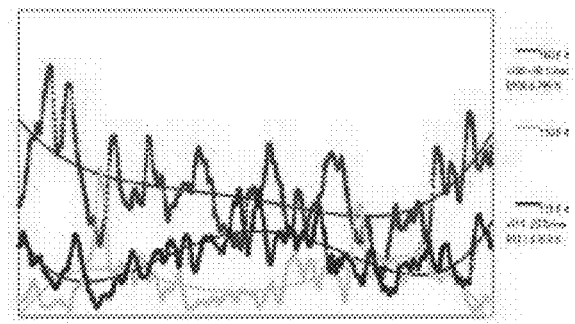
FIGS. 3A, 3B, and 3C are graphs of the results of measurements of the center, middle and edge, respectively, of the Ta plate in FIGS. 2A-2C in accordance with one embodiment of the present invention.
Figure 3B:
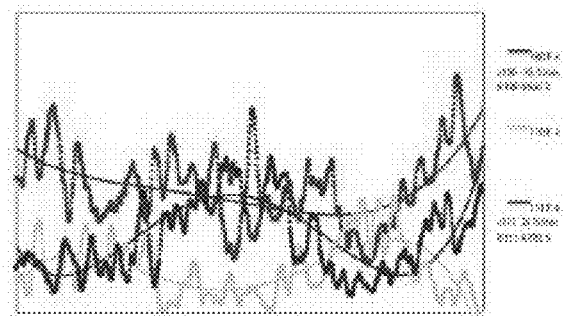
Figure 3C:
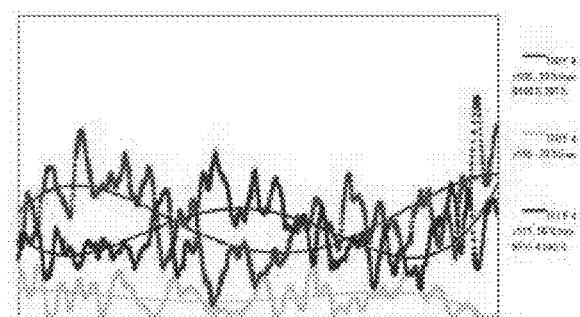

The texture of one target in accordance with one embodiment of the invention is shown in FIGS. 2A-2C. Here, the red color depicts $\{100\}$ texture, blue depicts $\{111\}$ texture and yellow represents $\{110\}$ texture. In FIGS. 2A-2C, the mole fraction of $\{100\}$ is 0.34, $\{111\}$ is 0.08, and $\{110\}$ is 0.19. (Each of these is multiplied by 100 to establish mole % present). The banding factor B is B $\{100\}$ 7% and B $\{111\}$ 5%. Banding factors of less than about 7%, for each of the $\{100\}$ and $\{111\}$ are beneficial with B factors of less than about 6% being even more preferred. The average B $\{100\}$ and B $\{111\}$ banding for the target is 6%, with an average B $\{100\}$ and B $\{111\}$ banding factor of less than about 5% being considered as beneficial. Thus, this target exhibits a predominate mix of $\{100\}$ and $\{111\}$ with no banding, and $\{110\}$ is present in a small amount.

The Ta targets in accordance with the invention exhibit predominate mixed $\{100\}$ $\{111\}$ texture, i.e., both $\{100\}$ and $\{111\}$ textures, when combined, equal greater than 42% mole fraction (based on 100% mole fraction), and the targets banding factors B $\{100\}$ and B $\{111\}$ are each less than 7%.

In another exemplary embodiment of the invention, a thin film for semiconductor applications created by using the aforementioned method is described. The thin films formed by the sputtering targets produced in accordance with this invention have a variation in film thickness uniformity (percent non-uniformity) of 3% or less, and more preferably 3% or less. Furthermore, the thin film formed by sputtering targets produced in accordance with this invention, have a variation in sheet resistance, within wafers, and between wafers, 3% or less, and more preferably 3% or less.

In the foregoing specification, the invention has been described with reference to specific embodiments thereof. It will be evident that various modifications and changes can be made to the methods and targets of the invention without departing from the broader spirit or scope of the invention as set forth in the appended claims. Accordingly, the specification is to be regarded in an illustrative rather than a restrictive sense.

The invention claimed is:

1. A method of making a metal or metal alloy target comprising the steps of:
   a) providing a billet, said billet having a generally cylindrical configuration and having an x, y and z dimensional direction, wherein said x direction is the central axis;
   b) sectioning said billet by cutting said billet parallel to a first dimensional direction to form at least a target blank;
   c) cutting said at least a target blank in half parallel to said central axis to form a half cylindrical blank; and
   d) cross rolling said half cylindrical blank to form a target.

2. The method as in claim 1, wherein said first dimensional direction is the y direction.

3. The method as in claim 1, wherein said billet is Ta or Ta alloy.

4. The method as in claim 1, wherein said billet is Nb, Fe, Co, Al, Cu, or Ti.

5. The method as in claim 1, wherein said billet is formed by compacting a metal powder.

6. The method as in claim 5, wherein said metal power is a metal or metal alloy power and is selected from the group consisting of Nb, Fe, Co, Al, Cu, Ti or Ta.

7. The method as in claim 1, wherein said step of cutting said target blank in half forms at least a pair of half cylindrical blanks.

8. The method as in claim 1, wherein said step of cross rolling includes the step of feeding a half cylindrical blank through a rolling mill.

9. The method as in claim 1, wherein said target has a predominate mix of {100} and {111} textures and has reduced {100} and {111} banding factors wherein each of the B {100} and B {111} banding factors is less than 7%.

10. The method as in claim 9, wherein B {100} and B {111} are each less than 7%.

11. The method as in claim 3, wherein said Ta has a purity of 99.95% and greater, and a uniform grain size of about 100 microns.

* * * * *